United States Patent [19]

Mead et al.

[11] Patent Number: 4,593,393
[45] Date of Patent: Jun. 3, 1986

[54] QUASI PARALLEL CYCLIC REDUNDANCY CHECKER

[75] Inventors: Barry B. Mead, Mesa; Gerald V. Piosenka, Scottsdale, both of Ariz.

[73] Assignee: Motorola, Inc., Schaumburg, Ill.

[21] Appl. No.: 577,097

[22] Filed: Feb. 6, 1984

[51] Int. Cl.[4] .............................................. G06F 11/10
[52] U.S. Cl. ......................................... 371/37; 371/38
[58] Field of Search ................... 371/37, 38, 49, 1, 21; 364/200 MS File, 900 MS File

[56] References Cited

U.S. PATENT DOCUMENTS

| 3,452,328 | 6/1969 | Mu-Yue Hsiaso | 371/37 |
|---|---|---|---|
| 3,458,860 | 7/1969 | Shimabukuro | 371/49 |
| 3,601,800 | 8/1971 | Hua-Tung Lee | 371/37 |
| 3,703,705 | 11/1972 | Patel | 371/37 |
| 4,044,329 | 8/1977 | Besenfelder et al. | 371/1 |
| 4,049,956 | 9/1977 | Van Veen | 371/21 |
| 4,225,809 | 3/1981 | Hillman | 315/371 |
| 4,312,068 | 1/1982 | Goss | 371/37 |
| 4,314,097 | 2/1982 | Campbell | 378/22.08 |
| 4,375,100 | 2/1983 | Tsuji et al. | 371/38 |
| 4,454,600 | 6/1984 | LeGresky | 371/37 |
| 4,498,174 | 2/1985 | LeGresky | 371/37 |

OTHER PUBLICATIONS

Clough, et al., "Semi-Parallel Generation of CRC Character", IBM Tech. Disclosure Bulletin, vol. 19, No. 9, Feb. 1977, pp. 3555-3556.
Nicholson, "Cyclic Redundancy Check System", IBM Tech. Disclosure Bulletin, vol. 19, No. 9, Feb. 1977, p. 3550.
Hsiao et al., "Serial to Parallel Transformation of Linear-Feedback Shift Register Circuits", IEEE Trans. on Electronic Computers, Dec. 1964.
"8-Bit Parallel CRC Generator/Checker Using Field Programmable Logic", Electronic Product Design, Mar. 1981.

Primary Examiner—Michael R. Fleming
Attorney, Agent, or Firm—Raymond J. Warren

[57] ABSTRACT

Method and apparatus for operating a CRC in a parallel, quasi parallel or serial fashion. The device allows all the bits in a word to be read and loaded into the cyclic redundancy checker (CRC) register in one clock cycle putting it in sync with the rest of the system. The CRC consists of a set of logic gates for converting a parallel input signal to a converted parallel input signal that is the equivalent of the conversion performed on the serial data input into the prior art cyclic redundancy checkers. The bits of the converted parallel input signal are then combined in another set of logic gates to provide the CRC output.

13 Claims, 7 Drawing Figures

CLOCK PULSE: CK1 | CK2 | CK3 | CK4 | CK5 | CK6 | CK7 | CK8

CRC REGISTERS: Q0 | Q1 | Q2 | Q3 | Q4 | Q5 | Q6 | Q7 | Q8 | Q9 | Q10 | Q11 | Q12 | Q13 | Q14 | Q15

INITIAL CRC REGISTER STATES (1 BIT PER CLOCK PULSE):

| C0 | C1 | C2 | C3 | C4 | C5 | C6 | C7 | C8 | C9 | C10 | C11 | C12 | C13 | C14 | C15 |
|----|----|----|----|----|----|----|----|----|----|----|----|----|----|----|----|
| Z | C0 | C1 | C2 | C3 | C4 | C5 | C6 | C7 | C8 | C9 | C10 | C11 | C12 | C13 | C14 |
| Y | Z | C0 | C1 | C2 | C3 | C4 | C5 | C6 | C7 | C8 | C9 | C10 | C11 | C12 | C13 |
| X | Y | Z | C0 | C1 | C2 | C3 | C4 | C5 | C6 | C7 | C8 | C9 | C10 | C11 | C12 |
| W | X | Y | Z | C0 | C1 | C2 | C3 | C4 | C5 | C6 | C7 | C8 | C9 | C10 | C11 |
| V | W | X | Y | Z | C0 | C1 | C2 | C3 | C4 | C5 | C6 | C7 | C8 | C9 | C10 |
| U | V | W | X | Y | Z | C0 | C1 | C2 | C3 | C4 | C5 | C6 | C7 | C8 | C9 |
| T | U | V | W | X | Y | Z | C0 | C1 | C2 | C3 | C4 | C5 | C6 | C7 | C8 |
| S | T | U | V | W | X | Y | Z | C0 | C1 | C2 | C3 | C4 | C5 | C6 | C7 |

REGISTER INPUT: S | T | U | V | W | X | Y | Z

WORD INPUT: B0 | B1 | B2 | B3 | B4 | B5 | B6 | B7

FIG. 4

WORD INPUT

| B0 | B1 | B2 | B3 | B4 | B5 | B6 | B7 |
|----|----|----|----|----|----|----|----|

REGISTER INPUT

| S | T | U | V | W | X | Y | Z |
|---|---|---|---|---|---|---|---|

CRC REGISTERS

| Q0 | Q1 | Q2 | Q3 | Q4 | Q5 | Q6 | Q7 | Q8 | Q9 | Q10 | Q11 | Q12 | Q13 | Q14 | Q15 |
|----|----|----|----|----|----|----|----|----|----|-----|-----|-----|-----|-----|-----|

INITIAL CRC REGISTER STATES

| CLOCK PULSE | C0 | C1 | C2 | C3 | C4 | C5 | C6 | C7 | C8 | C9 | C10 | C11 | C12 | C13 | C14 | C15 |
|-------------|----|----|----|----|----|----|----|----|----|----|-----|-----|-----|-----|-----|-----|
| CK1 | S0 | T0 | U0 | V0 | W0 | X0 | Y0 | Z0 | C0 | C1 | C2 | C3 | C4 | C5 | C6 | C7 |
| CK2 | S1 | T1 | U1 | V1 | W1 | X1 | Y1 | Z1 | S0 | T0 | U0 | V0 | W0 | X0 | Y0 | Z0 |
| CK3 | | | | | | | | | | | | | | | | |
| CK4 | | | | | | | | | | | | | | | | |
| CK5 | | | | | | | | | | | | | | | | |
| CK6 | | | | | | | | | | | | | | | | |
| CK7 | | | | | | | | | | | | | | | | |
| CK8 | | | | | | | | | | | | | | | | |

WORD INPUT

| B0 | B1 | B2 | B3 | B4 | B5 | B6 | B7 |

REGISTER INPUT

| S | T | U | V | W | X | Y | Z |

CRC REGISTERS

| Q0 | Q1 | Q2 | Q3 | Q4 | Q5 | Q6 | Q7 | Q8 | Q9 | Q10 | Q11 | Q12 | Q13 | Q14 | Q15 |

INITIAL CRC REGISTER STATES

| C0 | C1 | C2 | C3 | C4 | C5 | C6 | C7 | C8 | C9 | C10 | C11 | C12 | C13 | C14 | C15 |
|----|----|----|----|----|----|----|----|----|----|-----|-----|-----|-----|-----|-----|
| W | X | Y | Z | C0 | C1 | C2 | C3 | C4 | C5 | C6 | C7 | C8 | C9 | C10 | C11 |
| S | T | U | V | W | X | Y | Z | C0 | C1 | C2 | C3 | C4 | C5 | C6 | C7 |
| | | | | | | | | | | | | | | | |
| | | | | | | | | | | | | | | | |
| | | | | | | | | | | | | | | | |
| | | | | | | | | | | | | | | | |
| | | | | | | | | | | | | | | | |
| | | | | | | | | | | | | | | | |

CLOCK PULSE

| CK1 | CK2 | CK3 | CK4 | CK5 | CK6 | CK7 | CK8 |

QUASI PARALLEL CYCLIC REDUNDANCY CHECKER

BACKGROUND OF THE INVENTION

1. Field of the Invention

This invention relates, in general, to cyclic redundancy checkers (CRC), and more particularly, to quasi parallel cyclic redundancy checkers.

2. Description of Prior Art

A conventional CRC is used to check the stored program in a device upon startup. All the instructions in the program are output one word at a time to a multiplexer, which breaks each word down and transmits one bit at a time to the CRC. This process requires that a second clock be used to trigger the serial output of data bytes from the multiplexer to the CRC, since the bits must be transmitted to the CRC eight times, in an eight bit word, faster than the words are transmitted to the multiplexer. Often this process requires that the transmission of the word to the multiplexer be slowed in order to transmit all of one word serially to the CRC before the next word is input to the multiplexer. The CRC register itself contains 16 D-type flip-flop shift registers ($Q_0$–$Q_{15}$) where the data is input one bit at a time. As the data is input the bit is combined with several of the previous bits in a cascade of exclusive-OR gates to produce the bit that is stored in the register. Once the entire program has been entered, one bit at a time, a reference word, or words, is entered that, if the program was correct, should clear the registers. If the registers are not cleared this indicates there was an error in the program.

This type of CRC has a number of problems. Often the CRC's are used in systems that have very long complicated programs. Reading one bit per clock pulse takes a great deal of time and reduces the overall efficiency of the device requiring the use of such a circuit.

Another problem arises in the standard parallel transmission of data. Since data is most often transmitted in parallel, this parallel transmission must be converted into a serial transmission before it can be run through the present type of CRC.

Still another problem arises in the need of a separate clock to operate the transmission of data from the multiplexer to the CRC.

SUMMARY OF THE INVENTION

Accordingly, it is an object of the present invention to provide an improved apparatus and method for implementing a CRC to various systems.

Another object of the present invention is to allow the addition of a CRC to existing systems without requiring modification of the existing system's timing or the addition of asynchronous clocks.

Still another object of the present invention is to provide a CRC that can replace existing CRCs in a unit without requiring modification of the existing device using the CRC.

Yet another object of the present invention is to use a parallel or quasi parallel input in addition to a serial input.

Yet another object of the present invention is to reduce the time necessary for the CRC to operate.

The above and other objects and advantages of the present invention are provided by a particular embodiment of the present invention which comprises an apparatus and method for operating a CRC with a parallel rather than a serial data bus. The eight bits of a word, for an eight bit word, are input simultaneously through a series of complex, interconnected excusive-OR gates so the resulting bits stored in the register are the same as if they had been serially input as in the prior CRCs. This allows the present invention to be substituted in a system that has already been manufactured without the need of additional modification. These eight bits are then stored in a first set of eight flip-flops until the next word is transmitted at which time the first set of eight bits is transferred to a second set of eight flip-flops. When reading eight bits at a time this eliminates the need for any asynchronous clock and will allow the system to operate in a more efficient manner.

BRIEF DESCRIPTION OF THE DRAWINGS

FIG. 2 is a chart of CRC register states of a serial CRC as a function of the clock;

FIG. 4 is a chart of CRC register states of a CRC reading eight bits per clock pulse as a function of the clock;

FIG. 5 is a chart of CRC register states of a CRC reading two bits per clock pulse as a function of the clock;

FIG. 7 is a chart of CRC register states of a CRC reading four bits per clock pulse as a function of the clock.

DETAILED DESCRIPTION OF THE INVENTION

Figure 1:
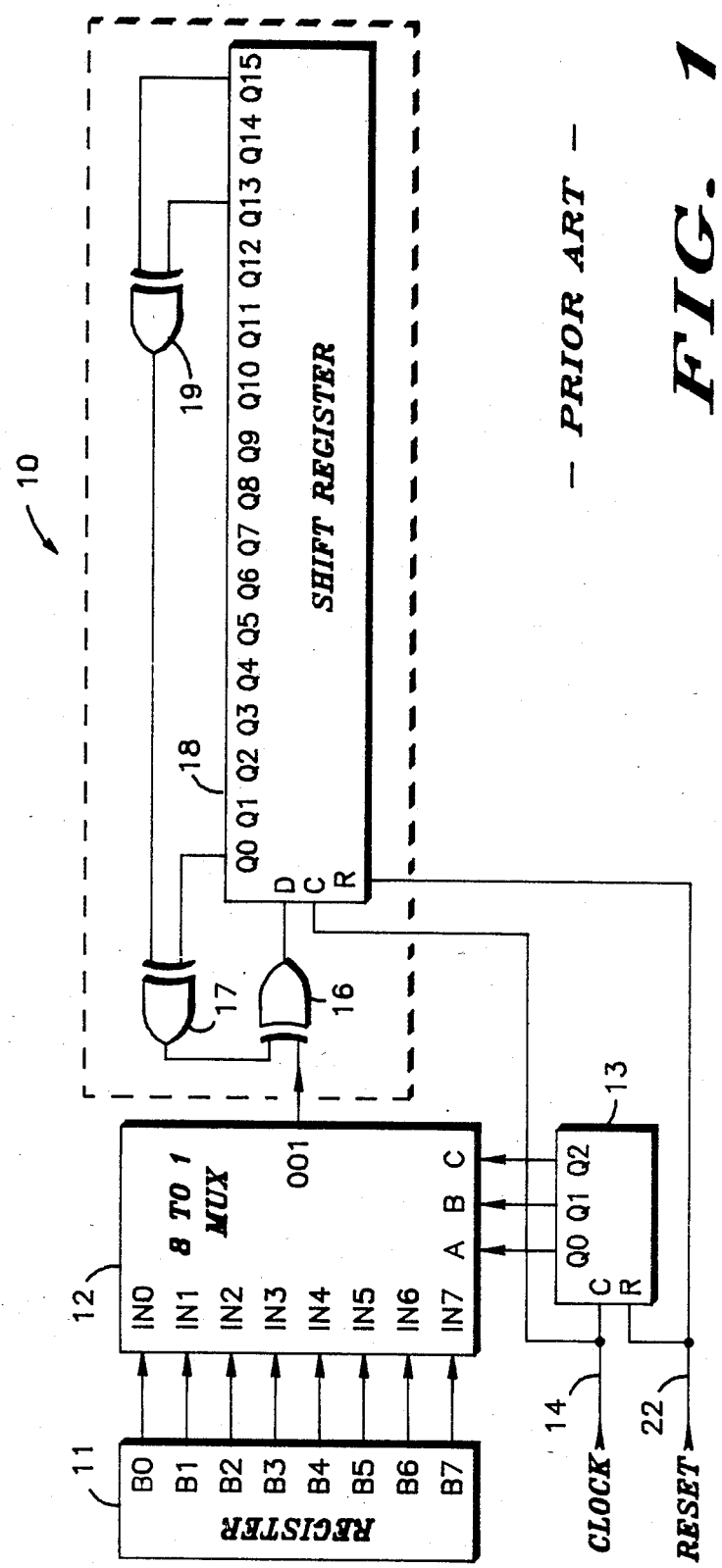
FIG. 1 is a schematic diagram of a prior art CRC circuit.

A typical prior art CRC, generally designated 10, is illustrated in FIG. 1. The standard operation consists of a word being transferred in parallel from a register, or memory, 11 to a multiplexer 12. Multiplexer 12 is driven by a modulo eight counter 13 which is clocked by a source (not shown) which provides eight clock edges per word adapted to be connected to a terminal 14. One bit per clock pulse is transmitted to a dual input exclusive-OR gate 16 of CRC 10 where it is modulo two summed with the output from a dual input exclusive-OR gate 17. The output of gate 17 is produced by the input of $Q_0$ from a 16 bit shift register 18 and the output of a dual input exclusive-OR gate 19. The output of gate 19 is produced by the input of $Q_{13}$ and $Q_{15}$ of shift register 18. The output of gate 16 is then input to shift register 18 where it is stored in $Q_0$. Shift register 18 is operated by the clock (not shown) adapted to be connected to terminal 14 to input the incoming bits and shift the presently stored bits from flip-flop $Q_0$ to flip-flop $Q_{15}$. A typical CRC unit requires M clock pulses to load M bits of data. The cycle is initiated by a reset signal, applied to a terminal 22, transmitted to modulo eight counter 13 and register 18.

Referring to FIG. 2 the initial states ($C_0$–$C_{15}$) of flip-flops $Q_0$–$Q_{15}$ of register 18 are shown prior to the first clock pulse. The word being input into the CRC is illustrated as $B_0$–$B_7$. The input, D, to register 18 is represented by a register input Z-S for CRC input $B_0$–$B_7$ respectively. Register input Z-S is entered into the $Q_0$ flip-flop and is determined by the equation:

$$D = C_{15} \oplus C_{13} \oplus C_0 \oplus B_N$$

where $C_{15}$, $C_{13}$ and $C_0$ are the states of flip-flops $Q_{15}$, $Q_{13}$ and $Q_0$, respectively, and $B_N$ is the current data bit being entered.

As illustrated in the graph it would require eight clock pulses ($Ck_1$–$Ck_8$) to move the first input, Z, from $Q_0$ to $Q_7$.

Figure 3:
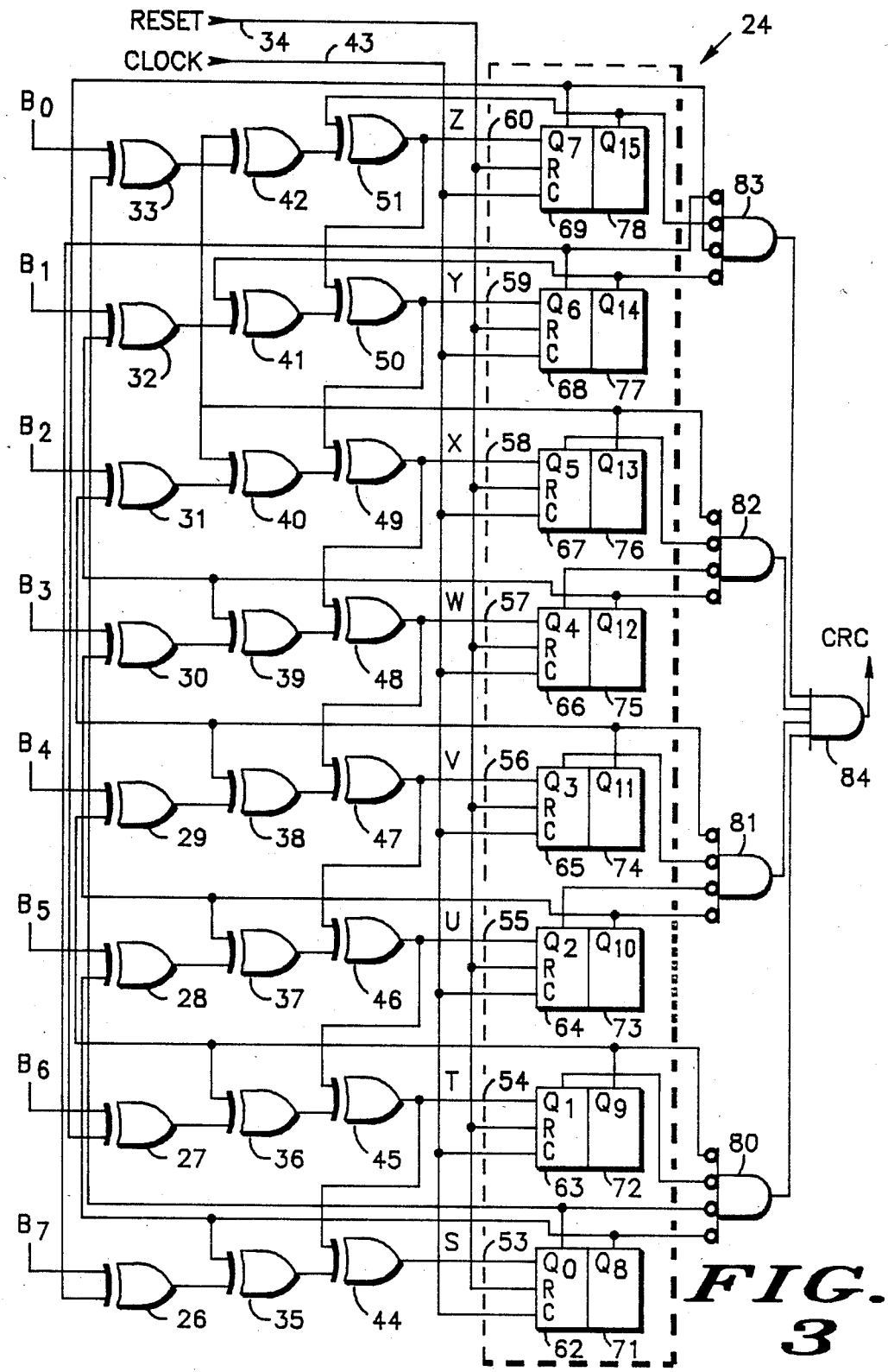
FIG. 3 is a schematic diagram of an eight-bit CRC embodying the present invention.

The present invention reduces the number of clock pulses required to transfer data from the register, or memory, to the CRC register. Referring now to FIG. 3 a preferred embodiment of the present invention is shown which will load eight bits per clock pulse. CRC register 24 is reset prior to the reception of data by a reset signal connected to a node 34. Bits $B_7$–$B_0$ of a word are input to a first battery of dual input exclusive-OR gates 26-33. The output from the first battery of exclusive-OR gates 26-33 is input into a second battery of exclusive-OR gates 35-42. The output from the second battery of exclusive-OR gates 35-42 is then input into a third battery of exclusive-OR gates 44-51. Exclusive-OR gates 26-33; 35-42; and 44-31 may be generally described as a conversion means for converting a parallel input of the CRC. The output from the third battery of exclusive-OR gates 44-51 is the input S-Z to a CRC register 24 carried on a set of lines 53-60. The CRC register 24 is divided into two sets of flip-flops, a first set 62-69 and a second set 71-78. Inputs S-Z, on lines 53-60, are input to the first set of flip-flops 62-69 on a first clock pulse of a clock connected to a node 43 and then shifted into the second set of flip-flops 71-78 on a second clock pulse. Flip-flop 62-69 and 71-78 may be generally described as a register means. The outputs from the first set 62-69 and second set 71-78 of flip-flops are inverted and combined in a set of quad input AND gates 80-83 with their outputs being combined in a quad input AND gate 84. AND gates 80-84 may be generally described as combining means. The output of gate 84 is a CRC signal.

More particularly FIG. 3 shows $B_0$ being input to exclusive-OR gate 33 where it is ORed with the output from flip-flop 62. The output from exclusive-OR gate 33 is input into exclusive-OR gate 42 where it is ORed with the output from flip-flop 76. The output from exclusive-OR gate 42 is input into exclusive-OR gate 51 where it is ORed with the output from flip-flop 78. The output from exclusive-OR gate 51 is carried along line 60 to flip-flop 69, which is the equivalent of the Z input illustrated in FIG. 2.

Bit $B_1$ is input to exclusive-OR gate 32 where it is ORed with the output from flip-flop 75. The output from exclusive-OR gate 32 is input into exclusive-OR gate 41 where it is ORed with the output from flip-flop 77. The output from exclusive-OR gate 41 is input into exclusive-OR gate 50 where it is ORed with the output of exclusive-OR gate 51. The output from exclusive-OR gate 50 is then transmitted along line 59 to flip-flop 68, which is the equivalent of the Y input illustrated in FIG. 2.

Bit $B_2$ is input into exclusive-OR gate 31 where it is ORed with the output from flip-flop 74. The output from exclusive-OR gate 31 is then input into exclusive-OR gate 40 where it is ORed with the output from flip-flop 76. The output from exclusive-OR gate 40 is input into exclusive-OR gate 49 where it is ORed with the output of exclusive-OR gate 50. The output from exclusive-OR gate 49 is then transmitted along line 58 to flip-flop 67, which is the equivalent of the X input illustrated in FIG. 2.

Bit $B_3$ is input into exclusive-OR gate 30 where it is ORed with the output from flip-flop 73. The output from exclusive-OR gate 30 is then input into exclusive-OR gate 39 where it is ORed with the output from flip-flop 75. The output from exclusive-OR gate 39 is then input into exclusive-OR gate 48 where it is ORed with the output from exclusive-OR gate 49. The output from exclusive-OR gate 48 is transmitted along line 57 to flip-flop 66, which is equivalent to the W input illustrated in FIG. 2.

Bit $B_4$ is input to exclusive-OR gate 29 where it is ORed with the output from flip-flop 72. The output from exclusive-OR gate 29 is then input into exclusive-OR gate 38 where it is ORed with the output from flip-flop 74. The output from exclusive-OR gate 38 is then input into exclusive-OR gate 47 where it is ORed with the output from exclusive-OR gate 48. The output from exclusive-OR gate 47 is then output along line 56 to flip-flop 65, which is the equivalent to the V input illustrated in FIG. 2.

Bit $B_5$ is input into exclusive-OR gate 28 where it is ORed with the output from flip-flop 71. The output from exclusive-OR gate 28 is then input into exclusive-OR gate 37 where it is ORed with the output from flip-flop 73. The output from exclusive-OR gate 37 is then input into exclusive-OR gate 46 where it is ORed with the output from exclusive-OR gate 47. The output from exclusive-OR gate 46 is then transmitted along line 55 to flip-flop 64, which is the equivalent to the U input illustrated in FIG. 2.

Bit $B_6$ is input into exclusive-OR gate 27 where it is ORed with the output of flip-flop 69. The output of exclusive-OR gate 27 is input into exclusive-OR gate 36 where it is ORed with the output from flip-flop 72. The output from exclusive-OR gate 36 is then input into exclusive-OR gate 45 where it is ORed with the output of exclusive-OR gate 46. The output of exclusive-OR gate 45 is then output along line 54 to flip-flop 63, which is the equivalent to the T input illustrated in FIG. 2.

Bit $B_7$ is input into exclusive-OR gate 26 where it is ORed with the output from flip-flop 68. The output from exclusive-OR gate 26 is then input into exclusive-OR gate 35 where it is ORed with the output from flip-flop 71. The output from exclusive-OR gate 71 is then input into exclusive-OR gate 44 where it is ORed with the output from exclusive-OR gate 45. The output from exclusive-OR gate 44 is then transmitted along line 53 to flip-flop 62 which is the equivalent to the S input illustrated in FIG. 2.

On a first clock pulse the signals on lines 53-60 (S-Z) are transferred into flip-flops 62-69 ($Q_0$–$Q_7$), respectively, of CRC register 24. On the next clock pulse the signals S-Z are shifted from flip-flops 62-69 to flip-flops 71-78 ($Q_8$–$Q_{15}$).

The outputs from flip-flops 62, 63, 71 and 72 ($Q_0$, $Q_1$, $Q_8$ and $Q_9$) are transmitted to AND gate 80 where the signals are inverted before entering. The outputs from flip-flops 64, 65, 73 and 74 ($Q_2$, $Q_3$, $Q_{10}$ and $Q_{11}$) are transmitted to AND gate 81 where the signals are inverted before entering. The outputs from flip-flops 66, 67, 75 and 76 ($Q_4$, $Q_5$, $Q_{12}$ and $Q_{13}$) are transmitted to AND gate 82 where the signals are inverted before entering. The outputs from flip-flops 68, 69, 77 and 78 ($Q_6$, $Q_7$, $Q_{14}$ and $Q_{15}$) are transmitted to AND gate 83 where the signals are inverted before entering.

The outputs from AND gates 80-83 are coupled to AND gate 84 where the signals are ANDed to produce the CRC signal.

In FIG. 4 a chart of the CRC register states is shown for reading eight bits per clock as described in FIG. 3 above. Word $B_7$-$B_0$ is converted into signals $S_0$-$Z_0$ and input into flip-flops 62-69 ($Q_0$-$Q_7$) of register 24 on the first clock pulse. This word is then shifted into flip-flops 71-78 ($Q_8$-$Q_{15}$) on the next clock pulse at the same time a new word ($S_1$-$Z_1$) is loaded into flip-flops 62-69 ($Q_0$-$Q_7$).

Figure 5:
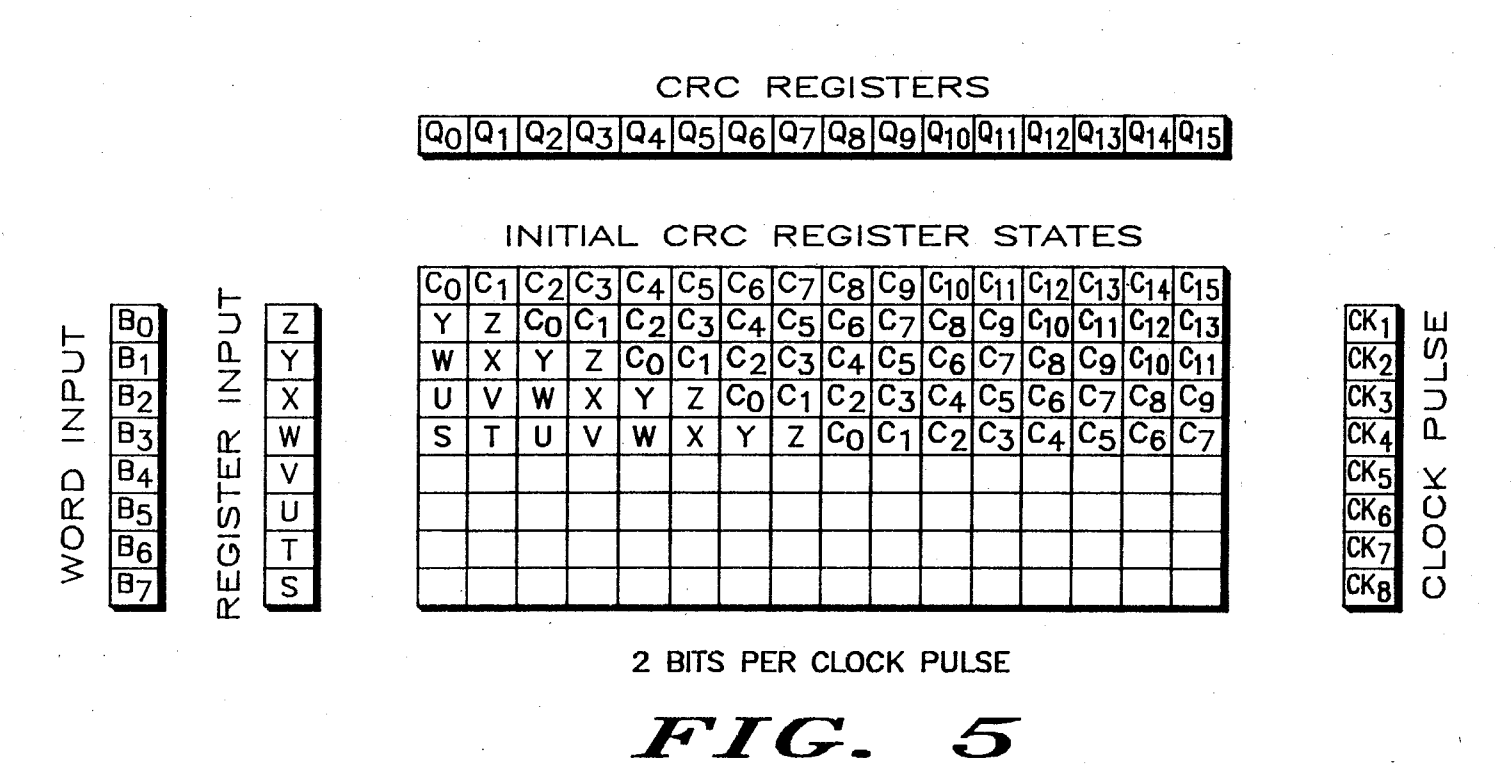

Referring now to FIG. 5 a chart of a CRC register is shown for reading two bits per clock pulse. FIG. 3 could be easily modified to read two bits per clock pulse. This will be more apparent after FIG. 6. Reading two bits per clock pulse requires four clock pulses to move input $B_0$ (Z) from the input of flip-flop $Q_1$ to flip-flop $Q_7$. On the first clock pulse two bits Y and Z are input into registers $Q_0$ and $Q_1$. On the second pulse two new bits W and X are input into registers $Q_0$ and $Q_1$, respectively, and bits Y and Z are transferred to registers $Q_2$ and $Q_3$, respectively. This process of inputting two bits at a time is continued until the entire word is read in. While this process requires more time than that described in FIG. 3 it is faster than the standard serial input form which would require eight clock pulses, see FIG. 1.

Figure 6:
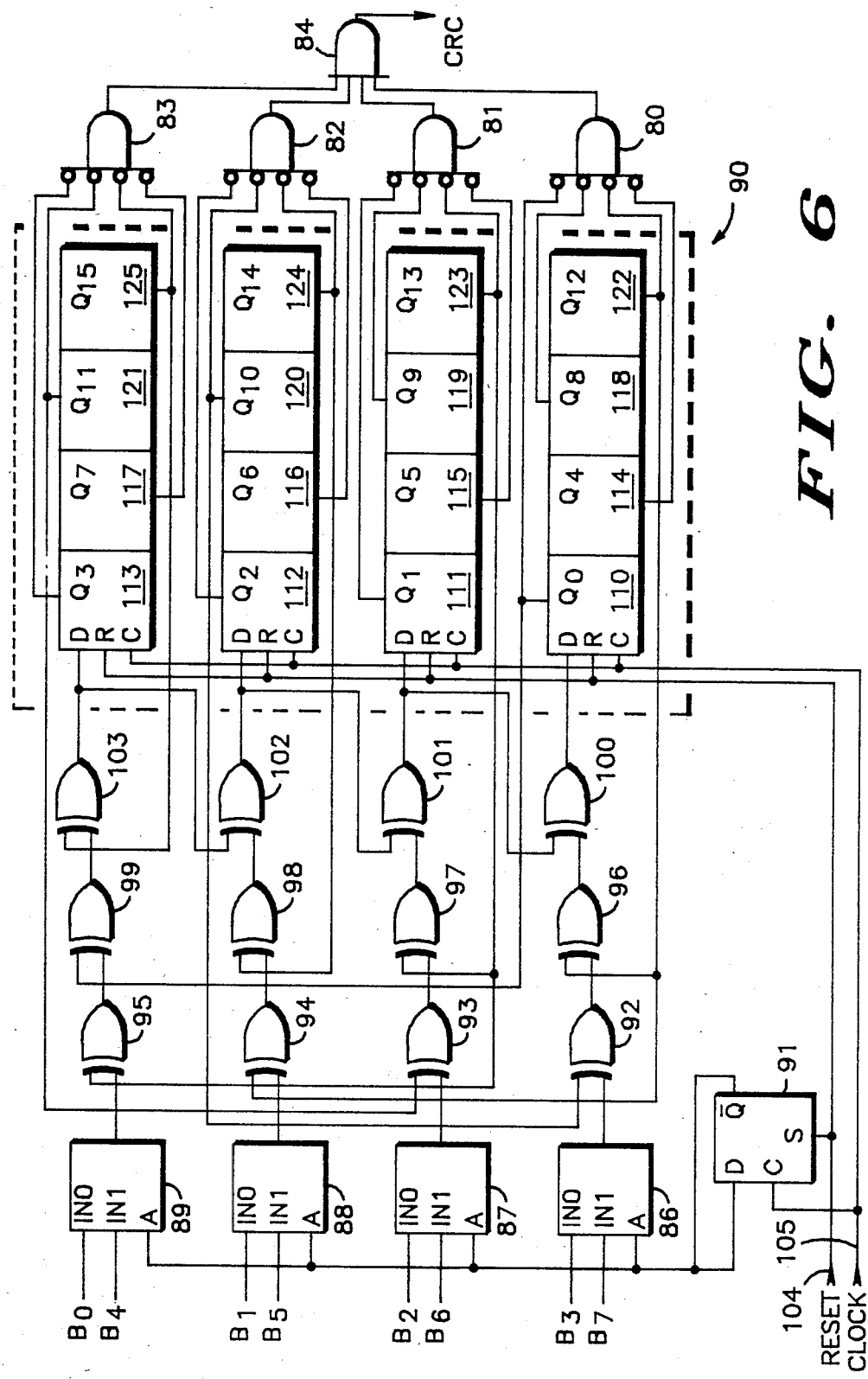
FIG. 6 is a schematic diagram of a four-bit CRC embodying the present invention.

Referring to FIG. 6 a schematic diagram of a four-bit CRC embodying the present invention is illustrated. The four-bit circuit consists of a set of multiplexers 86-89 controlled by a flip-flop 91 which is triggered by an asynchronous clock connected to a node 104. The signals passing through multiplexer 86-89 proceed through a set of exclusive-OR gates 92-103 to CRC register 90 carried on a set of lines 105-108. The CRC register 90 is divided into four sets of flip-flops; a first set 110-113, and second set 114-117, a third set 118-121 and a fourth set 122-125. The signals from flip-flops 110-125 are inverted and processed through a set of AND gates 80-83 with their outputs being ANDed in an AND gate 84, in the same fashion illustrated in the 8-bit schematic FIG. 3.

More particularly FIG. 6 shows an 8-bit word $B_0$-$B_7$ being input to multiplexers 86-89. Bits $B_3$-$B_0$ are coupled to the IN0 input of multiplexers 86-89, respectively, and bits $B_7$-$B_4$ are coupled to the IN1 input of multiplexers 86-89, respectively. A clock signal triggers flip-flop 91 causing an output which is connected to input A of multiplexers 86-89 thereby causing inputs IN0 and IN1 to open alternatively, which results in the transmitting of $B_0$-$B_3$ and $B_4$-$B_7$ alternatively. Prior to receiving data CRC register 90 is reset by a reset signal coupled to a node 104.

The output from multiplexer 89 is input into exclusive-OR gate 95 where it is ORed with the output from flip-flop 123. The output from exclusive-OR gate 95 is input into exclusive-OR gate 99 where it is ORed with the output from flip-flop 110. The output from exclusive-OR gate 99 is input into exclusive-OR gate 103 where it is ORed with the output from flip-flop 125. The output from exclusive-OR gate 103 is then input to flip-flop 113 of CRC register 90.

The output from muliplexer 88 is input to exclusive-OR gate 94 where it is ORed with the output from flip-flop 122. The output from exclusive-OR gate 94 is then input to exclusive-OR 98 where it is ORed with the output from flip-flop 124. The output from exclusive-OR gate 98 is then input to exclusive-OR 102 where it is ORed with the output from exclusive-OR 103. The output from exclusive-OR 102 is then input to flip-flop 112 of CRC 90.

The output from multiplexer 87 is input to exclusive-OR 93 where it is ORed with the output from flip-flop 121. The output from exclusive-OR gate 93 is then input to exclusive-OR gate 97 where it is ORed with the output from flip-flop 123. The output from exclusive-OR gate 97 is then input to exclusive-OR gate 101 where it is ORed with the output from exclusive-OR gate 102. The output from exclusive-OR gate 101 is then input to flip-flop 111 of CRC register 90.

The output from multiplexer 86 is input to exclusive-OR gate 92 where it is ORed with the output from flip-flop 120. The output from exclusive-OR gate 92 is then input to exclusive-OR gate 96 where it is ORed with the output from flip-flop 122. The output from exclusive-OR gate 96 is then input to exclusive-OR gate 100 where it is ORed with the output from exclusive-OR 101. The output from exclusive-OR gate 100 is then input to flip-flop 110 of CRC 90.

Exclusive-OR gates 100-103 transmit signals (W-Z) to flip-flops 110-113, respectively. On a first clock pulse signals W-Z, derived from inputs $B_3$-$B_0$, are transferred into flip-flops 110-113, respectively, of register 90. On the next clock pulse signals W-Z are transferred into flip-flops 114-117, respectively, and new signals S-V derived from inputs $B_7$-$B_4$, are transferred into flip-flops 110-113.

The outputs from flip-flops 110-125 are inverted and connected to AND gates 80-83. The outputs from AND gates 80-83 are connected to AND gate 84 to produce a CRC signal.

Referring to FIG. 7, a chart of the CRC register for the four-bit CRC of FIG. 6 is illustrated. Reading four bits per clock pulse requires two clock pulses to move input $B_0$(Z) from the input of flip-flop $Q_3$ to flip-flop $Q_7$.

Thus, it is apparent that there has been provided, in accordance with the invention, a device and method that fully satisfies the objects, aims, and advantages set forth above.

It has been shown that the present invention provides an apparatus and method of implementing a CRC to system without requiring additional circuitry or modification. It has further been shown that the CRC apparatus, containing a register of N length, is capable of processing M bits of data in K clock cycles where $N>M>K$.

Although specific logic circuit devices and circuit elements have been set forth in the specification, it is to be specifically understood that alternate logic elements and circuit elements having similar electrical characteristics may be substituted therefor.

While a preferred embodiment of the present invention has been disclosed and described, it will be obvious to those skilled in the art that various modifications and substitutions may be made without departing from the spirit and scope of the invention, and it is therefore aimed in the following claims to claim all such modifications.

We claim:

1. A clocked cyclic redundancy checker (CRC) wherein less than a whole parallel input signal received by said CRC is converted by a single clock pulse, said CRC having a parallel input, a clock input and an output, comprising:

multiplexer means for selecting a portion of said parallel input signal received by said CRC to be converted, said multiplexer means having a parallel input coupled to said parallel input of said CRC, a clock input coupled to said clock input of said CRC, and a parallel output;

a plurality of first logic gates for converting the selected portion of said parallel input signal to a converted parallel input signal, said plurality of first logic gates having a first parallel input coupled to said parallel output of said multiplexer means, a second parallel input, and a parallel output;

register means for storing said converted parallel input signal, said register means having a parallel input, a parallel output and a clock input, said parallel input being coupled to said parallel output of said plurality of first logic gates, said clock input being coupled to said clock input of said CRC and said parallel output being coupled to said second parallel input of said plurality of first logic gates; and combining means for combining said converted parallel input signal to form a CRC signal, said combining means having a parallel input and an output, said parallel input being coupled to said parallel output of said register means and said output being coupled to said output of said CRC.

2. The clocked CRC of claim 1 wherein said plurality of first logic gates comprises 3×M logic gates where M is defined as the number of bits read per clock pulse.

3. The clocked CRC of claim 2 wherein said register means comprises a plurality of flip-flops each having an input, an output and a clock input, said input being coupled to said parallel input of said register means, said output being coupled to said parallel output of said register means and said clock input being coupled to said clock input of said register means.

4. The clocked CRC of claim 3 wherein said register means comprises 2×N flip-flops, N being defined as the number of bits in said parallel input of said CRC.

5. The clocked CRC of claim 4 wherein said combining means comprises:

a plurality of second logic gates each having an input and an output, said input being coupled to said parallel input of said combining means; and a third logic gate having an input and an output, said input being coupled to said output of said plurality of second logic gates and said output being coupled to said output of said combining means.

6. The CRC of claim 5 wherein said combining means comprises N÷4 second logic gates, N being defined as the number of said flip-flops in said register means of said CRC.

7. The clocked CRC of claim 6 wherein said multiplexer means comprises M multiplexers, M being defined as the number of bits in the portion of said parallel input of said CRC read per pulse of said clock.

8. The CRC of claim 7 wherein said conversion means converts said parallel input of said CRC into an 8 bit converted parallel input.

9. The CRC of claim 7 wherein said conversion means converts said parallel input of said CRC into a 4 bit converted parallel input.

10. The CRC of claim 7 wherein said conversion means converts said parallel input of said CRC into a two bit converted parallel signal.

11. A method for transferring a word comprising 8 bits from a parallel data bus to a cyclic redundancy checker (CRC), comprising the steps of:

transferring a first set of eight bits of data into a first set of eight registers of said CRC on a first pulse of said clock;

moving said first set of eight bits of data into a second set of eight registers of said CRC on a subsequent pulse of said clock;

loading a second set of eight bits of data into said first set of eight registers of said CRC on said subsequent pulse of said clock; and repeating the moving and loading of said data each time said clock is triggered until X bits of data have been loaded into the registers of said CRC.

12. A clocked cyclic redundancy checker (CRC) having a parallel input and an output, comprising:

conversion means for converting a parallel input signal of said clocked CRC producing a converted parallel signal, said conversion means having a first parallel input, a second parallel input and a parallel output, said first parallel input being coupled to said parallel input of said clocked CRC;

a multi-bit register for receiving and storeing said converted parallel signal from said conversion means, said multi-bit register having a clock input, a parallel input coupled to said parallel output of said conversion means, a parallel output coupled to said second parallel input of said conversion means, a first set and a second set of flip-flops, said first set of flip-flops having a parallel input, a parallel output and a clock input, said parallel input being coupled to said parallel input of said multi-bit register means, said parallel output being coupled to said parallel output of said multi-bit register means, said clock input being coupled to said clock input of said multi-bit register means, said second set of flip-flops having a parallel input, a parallel output and a clock input, said parallel input being coupled to said parallel output of said first set of flip-flops, said parallel output being coupled to said parallel output of said multi-bit register means, and said clock input being coupled to said clock input of said multi-bit register means;

a plurality of second logic gates, each having an input and an output, said input being coupled to said parallel output of said multi-bit register means;

a third logic gate having an input and an output, said input being coupled to said output of said plurality of second logic gates and said output being coupled to said output of said clocked CRC; and a clock coupled to said clock input of said multi-bit register for controlling the loading of said converted parallel signal from said conversion means into said first set of flip-flops of said multi-bit register and controlling the transfer of said converted parallel signal from said first set of flip-flops to said second set of flip-flops of said multi-bit register.

13. The clocked CRC of claim 12 wherein said conversion means comprises a plurality of first logic gates, each having an input and an output, for converting said parallel input of said clocked CRC by combining said parallel input of said clocked CRC with said output from a portion of said plurality of first logic gates and with said second parallel input of said conversion means, said output of said first logic gates being coupled to said parallel output of said conversion means.

* * * * *